(12) United States Patent
Tucker

(10) Patent No.: US 8,330,335 B2
(45) Date of Patent: Dec. 11, 2012

(54) PIEZO MAGNETOSTRICTIVE DEVICE

(75) Inventor: Randall L. Tucker, Findlay, OH (US)

(73) Assignee: Cooper Tire & Rubber Company, Findlay, OH (US)

( * ) Notice: Subject to any disclaimer, the term of this patent is extended or adjusted under 35 U.S.C. 154(b) by 238 days.

(21) Appl. No.: 12/803,644

(22) Filed: Jul. 1, 2010

(65) Prior Publication Data

US 2011/0001397 A1    Jan. 6, 2011

Related U.S. Application Data

(60) Provisional application No. 61/270,080, filed on Jul. 2, 2009.

(51) Int. Cl.
*H01L 41/08* (2006.01)
(52) U.S. Cl. .................. 310/339; 310/319
(58) Field of Classification Search .......... 310/339, 310/326, 311, 331, 319; *H01L 41/08*
See application file for complete search history.

(56) References Cited

U.S. PATENT DOCUMENTS

| | | |
|---|---|---|
| 5,562,787 A | 10/1996 | Koch et al. |
| 5,741,966 A | 4/1998 | Handfield et al. |
| 6,062,072 A | 5/2000 | Mock et al. |
| 6,809,516 B1 * | 10/2004 | Li et al. ................ 324/260 |
| 6,856,245 B2 | 2/2005 | Smith et al. |
| 6,897,770 B2 | 5/2005 | Lill |
| 6,943,660 B2 * | 9/2005 | Bower et al. ............. 338/47 |
| 7,009,576 B2 | 3/2006 | Adamson et al. |
| 7,069,642 B2 * | 7/2006 | Bower et al. ............. 29/619 |
| 7,132,939 B2 | 11/2006 | Tyndall et al. |
| 7,186,308 B2 | 3/2007 | Metcalf et al. |
| 7,504,947 B2 | 3/2009 | Tucker |
| 2005/0150740 A1 * | 7/2005 | Finkenzeller et al. ....... 194/207 |
| 2006/0046907 A1 | 3/2006 | Rastegar et al. |
| 2006/0075629 A1 * | 4/2006 | Bower et al. ............. 29/622 |
| 2006/0164250 A1 | 7/2006 | Kawai |

OTHER PUBLICATIONS

International Preliminary Report on Patentability; Date of Issuance of This Report Jan. 4, 2012.
International Search Report; Date of Mailing Oct. 21, 2010.

* cited by examiner

*Primary Examiner* — Thomas Dougherty
*Assistant Examiner* — Karen B Addison
(74) *Attorney, Agent, or Firm* — Emch, Schaffer, Schaub & Porcello Co., L.P.A.

(57) ABSTRACT

A piezo magnetostrictive device has a sheet of piezo material with an array of holes formed therein. At least some of the holes are filled with a magnetostrictive material which converts magnetic energy to mechanical energy by exhibiting a change in length or breadth upon being subjected to a change in magnetic energy. The sheet of piezo material generates an electrical potential in response to applied mechanical strain caused by such change in length or width of the magnetostrictive material in the holes.

23 Claims, 1 Drawing Sheet

PIEZO MAGNETOSTRICTIVE DEVICE

CROSS REFERENCE TO RELATED APPLICATIONS

The present application is based upon and claims the benefit of U.S. provisional patent application No. 61/270,080 filed Jul. 2, 2009.

BACKGROUND OF THE INVENTION

The present invention is directed to a piezo magnetostrictive device suitable as a stand alone power generating device for powering electronic devices or as a component of a radio frequency identification device (RFID) of a type which may be utilized for monitoring various functions of a tire such as numbers of rotation, speed, or air pressure. Patents which show the use of RFID devices for use with tires include my U.S. Pat. No. 7,504,947. Other devices, including RFID devices, which may be incorporated on a surface of or within the structure of a tire for monitoring various functions relative to the tire include the following U.S. Pat. Nos. 5,562,787; 5,741,966; 6,062,072; 6,856,245; 6,897,770; 7,009,576; and 7,186,308. The disclosures contained in these patents are incorporated herein by reference.

SUMMARY OF THE INVENTION

The present invention is directed to a device having a piezo structure having an array of holes, at least some of which are filled with a stress or strain generating compound such as a magnetostrictive material. When the magnetostrictive material is subjected to a change in magnetization, it undergoes a change in shape with the result that the magnetostrictive material in the holes of the piezo imparts a stretch or strain on the piezo material to thereby provide generation of electric power.

Objects and advantages of the present invention will become apparent to those skilled in the art upon a review of the following detailed description of the preferred embodiments and the accompanying drawings.

IN THE DRAWINGS

DETAILED DESCRIPTION OF THE PREFERRED EMBODIMENT(S)

Figure 1:
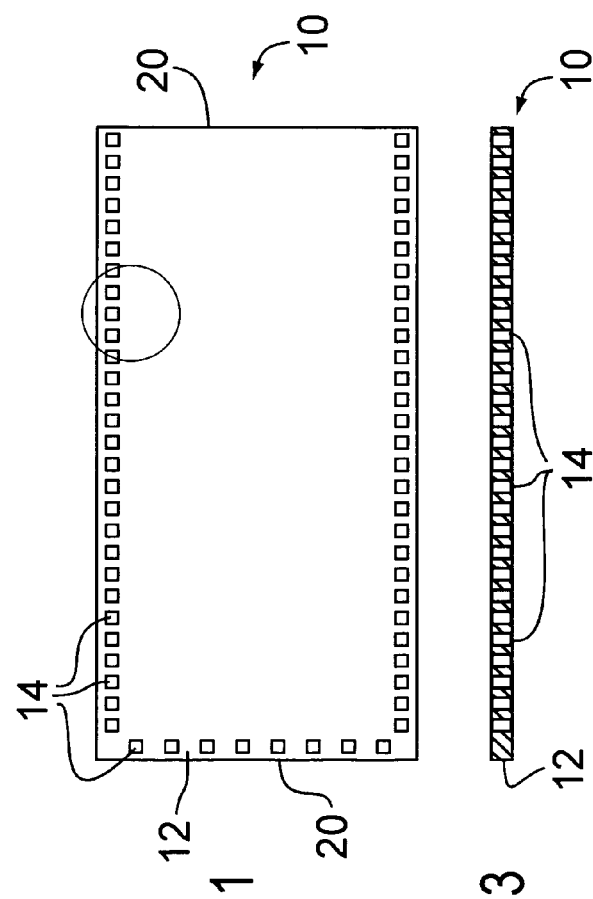
FIG. 1 is a plan view of the piezo magnetostrictive device of the present invention.
Figure 3:
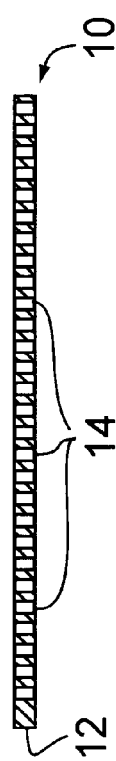
FIG. 3 is a sectional view taken through the device of FIG. 1.

Referring to FIG. 1 and FIG. 3 there is shown the piezo magnetostrictive device 10 of the present invention. The device comprises a sheet 12 of piezo material such as quartz, topaz, cane sugar, Rochelle salt, man-made crystals, power ceramics such as Langasite, barium titanate, or polymers such as polyvinylidene fluoride (PVDF). There are no shape or particular size requirements for the length or width of the sheet 12; however, preferably it is in the range of 0.1 to 200 millimeters (mm) in length and 0.1 to 200 mm in width. The thickness of the piezo sheet 12 should be in the range of 0.005 to 1.0 mm.

As is well known, piezo material has the ability to generate an electrical potential when subjected to an applied mechanical stress. Taking advantage of this property of piezo materials, the sheet 12 has formed therein an array of holes 14 which are filled with magnetostrictive materials which convert magnetic energy to mechanical energy by exhibiting a change in length or breadth upon being subjected to a change in magnetic energy. Magnetostrictive materials may include cobalt, Terfenol-D, an iron-gallium alloy with the tradename Galfenol and alloys such as NiMnGa. Additionally specifically designed ferro-fuilds may be utilized to induce the stress in the device. Although FIG. 1 shows the holes 14 only along the longitudinal edges and one widthwise edge, it should be understood that the holes 14 will preferably be substantially throughout the sheet 12 either in the pattern shown in FIG. 2 or the pattern shown in FIG. 4.

As noted above, piezo material has the property of generating an electrical potential in response to an applied mechanical strain. According to the present invention, such mechanical strain may be selectively imparted to the piezo sheet 12 by positioning in the holes 14 magnetostrictive material such as one of the materials set forth above or other material having similar properties.

Figure 2:
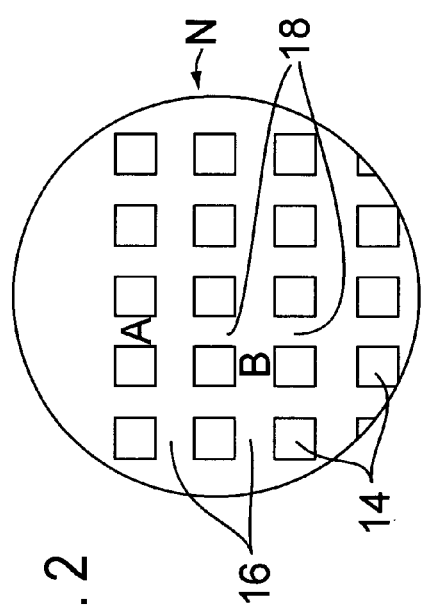
FIG. 2 is an enlarged view of a portion of FIG. 1 showing one form of alignment of holes in the piezo sheet.

Under the embodiment of FIG. 2, the holes 14, which can be of any shape or size, are positioned in an aligned matrix such that all holes 14 extending in a lengthwise direction are in one of a number of aligned straight line rows and all holes 14 extending in a widthwise direction are also in one of a series of aligned straight line rows extending widthwise with no interruptions. The holes 14 could be as small as one nanometer and as large as desired. The spaces between the aligned rows of holes 14 extend both lengthwise and widthwise of the sheet 12 on straight line paths without interruption. The spaces between the holes 14 aligned in the longitudinal direction are designated by the numeral 16 and the spaces between the holes 14 aligned in the widthwise direction are designated by the numeral 18.

Figure 4:
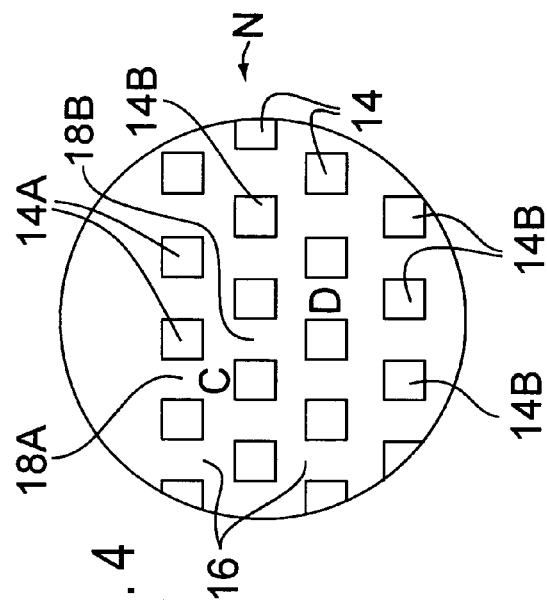
FIG. 4 is a view similar to FIG. 2 of a modified embodiment showing an alternating matrix of holes in the piezo sheet.

In contrast to the embodiment of FIG. 2, in FIG. 4 there is shown a modified embodiment in which the rows of holes 14 have an alternating matrix with respect to the rows of holes extending widthwise of the sheet 12. Thus, as can be clearly seen in FIG. 4, holes 14A define a first set of widthwise extending rows which are parallel to and spaced from one to another. A second set of holes 14B define a second set of widthwise rows which are parallel to and spaced from one another but which are offset from the first set of widthwise rows formed by holes 14A.

The spaces in the widthwise direction between the holes 14A are designated by the numeral 18A and the spaces in the widthwise direction between the holes 14B are designated by the numeral 18B. As a result of the positioning of the holes 14A and 14B of the alternating matrix of embodiment of FIG. 4, the spaces 18A and 18B do not provide uninterrupted rows in the widthwise directions. Thus, in this embodiment, holes 14A interrupt the row of spaces 18B and holes 14B interrupt the row of spaces 18A.

The row of spaces 16 in the longitudinal direction between the longitudinal row of holes 14A and the longitudinal row of holes 14B are uninterrupted.

The magnetostrictive material is positioned in some or all of the holes 14, including, in the case of the alternating matrix of FIG. 4, both sets of holes 14A and 14B. When the device 10 of the piezo sheet 12 with magnetostrictive material in the holes 14 is subjected to a change in the magnetization state thereof, the magnetostrictive material in the holes 14 will undergo a change of shape thereby resulting in a strain imparting a stretching to the piezo sheet 12 thereby providing power generation to the device 10.

As shown in FIG. 1, electrodes 20 are mounted on opposing ends of the piezo sheet 12.

It is also within the contemplation of the present invention that, in at least some areas of the sheet 12, rather than having holes which extend completely through the sheet as shown with the holes 14, there could be provided recesses which extend only part way through the thickness of the sheet 12. Some or all of such recesses would be filled with magnetostrictive material.

Although the piezo sheet 12 is shown in FIG. 1 as being rectangular in shape, it could have any of wide variety of shapes such as circular or oval, for example.

Variations in the specific formulation of the magnetostrictive material can be utilized to vary and/or maximize the performance capacity of the device 10. Tuning of the resonant frequency can be effected by varying such formulation as well as by varying the hole size, hole shape or hole density.

Additionally, the alternating matrix of placement of the holes as shown in FIG. 4 will provide a different performance characteristics than the aligned matrix of FIG. 2. Accordingly, by means of the above variations of the matrix, hole size, hole shape and hole density it is possible to tailor the device to have any one of a number of performance characteristics.

As may be seen in FIG. 2, the aligned matrix of holes 14 provides, upon a change in magnetization and exposure to a magnetic field from the direction indicated by arrow N, a stretching of the magnetostrictive material contained in the holes 14 thereby inducing a mechanical stretch to the piezo material of the sheet 12 in the area represented by the letter "A" in the widthwise spaces 18 between rows of holes 14. Similarly, spaces 16 between lengthwise aligned rows of holes 14 evidence a compressive force as represented by the letter "B", assuming a magnetic field from the direction indicated by the arrow N.

In the case of the alternating matrix shown in FIG. 4, the spaces 16 between the longitudinal extending rows 14A, 14B show the stretching in the area designated by the letter "C" due a change in the magnetization from the direction N of the magnetostrictive material in the holes 14. However, in contrast, to the hole alignment of FIG. 2, in the alternating matrix of FIG. 4, the spaces 18A between holes 14A are misaligned or out of alignment widthwise as are the spaces 18B between the apertures 14B. Assuming a magnetic field from the direction indicated by the arrow N, the spaces in the area designated "C" in FIG. 4 will be stretched and the spaces in the area designated "D" will be in compression.

As will be readily appreciated, although the embodiment shown in FIG. 4 shows positioning the holes 14A and 14B such that adjacent rows of holes are out of alignment widthwise with respect to one another, it is within the contemplation of the present invention that the lengthwise rows of holes 14 could also be out of alignment with adjacent rows of holes.

Variations in the magnetostrictive material and the compounding thereof could result in varying characteristics for the device 10 depending upon its specific application or desired performance capability. Tuning of the resonant frequency of the device 10 can be accomplished by varying the materials for the piezo sheet 12 and/or the magnetostrictive material, varying the size and/or shape of the holes 14 and/or varying the density or other arrangements of the holes 14.

The above detailed description of the present invention is given for explanatory purposes. It will be apparent to those skilled in the art that numerous changes and modifications can be made without departing from the scope of the invention. Accordingly, the whole of the foregoing description is to be construed in an illustrative and not a limitative sense, the scope of the invention being defined solely by the appended claims.

I claim:

1. A power generating device comprising:
   (a) a sheet of piezo material having the capability of generating an electric field when subjected to mechanical strain, said sheet having a thickness in the range of 0.005 to 200 mm and having (i) a first surface and a second surface spaced therefrom and substantially parallel thereto and (ii) a plurality of recesses or holes extending from the first surface toward the second surface, wherein said recesses or holes are square, said recesses or holes being positioned (A) in a plurality of rows, each extending in a straight line path in a first direction and being parallel to each adjacent row extending in said first direction, said first direction rows being spaced from each adjacent row to define a plurality of parallel aligned spaces, and (B) a plurality of rows, each extending in a second direction substantially perpendicular to said first direction; and
   (b) magnetostrictive material positioned in at least some of said recesses or holes.

2. A power generating device according to claim 1 wherein each of said rows extending in said second direction is spaced apart from each adjacent row extending in said second direction.

3. A power generating device according to claim 1 wherein alternate ones of said rows extending in said second direction are spaced apart from other alternate ones of said rows extending in said second direction but are not spaced apart from adjacent ones of said rows extending in said second direction.

4. A power generating device according to claim 3 wherein the recesses or holes defining adjacent rows extending in said second direction are positioned in alternate ones of said rows extending in said first direction.

5. A power generating device comprising:
   (a) a sheet of piezo material having the capability of generating an electric field when subjected to mechanical strain, said sheet having a thickness in the range of 0.005 to 1.0 mm and having (i) a first surface and a second surface spaced therefrom and substantially parallel thereto and (ii) a plurality of recesses or holes extending from the first surface toward the second surface, wherein said recesses or holes are square, (iii) first and second longitudinal edges and (iv) first and second end edges, both sets of said edges extending from said first surface to said second surface, said recesses or holes being positioned (A) in a plurality of longitudinal rows, each extending in a straight line path substantially parallel to said longitudinal edges, said longitudinal rows being spaced from each adjacent longitudinal row to define a plurality of parallel aligned spaces, said parallel aligned spaces being parallel to said longitudinal edges and (B) a plurality of widthwise rows, each extending in a straight line path parallel to each other; and
   (b) magnetostrictive material positoned in at least some of said recesses or holes.

6. A power generating device according to claim 5 wherein each of said widthwise rows is spaced apart from each adjacent widthwise row.

7. A power generating device according to claim 5 wherein alternate ones of said widthwise rows are spaced apart from other alternate ones of said widthwise rows but are not spaced apart from adjacent ones of said widthwise rows.

8. A power generating device according to claim 7 wherein the recesses or holes defining adjacent widthwise rows are positioned in alternate ones of said longitudinal rows.

9. A power generating device comprising:
(a) a sheet of piezo material having the capability of generating an electric field when subjected to mechanical strain, said sheet having (i) a first surface and a second surface spaced therefrom and substantially parallel thereto and (ii) a plurality of recesses or holes extending from the first surface toward the second surface, wherein said recesses or holes are square, said recesses or holes being positioned (A) in a plurality of rows, each extending in a straight line path in a first direction and being parallel to each adjacent row extending in said first direction, and (B) a plurality of rows, each extending in a second direction substantially perpendicular to said first direction; and
(b) magnetostrictive material positioned in at least some of said recesses or holes.

10. A power generating device according to claim 9 wherein said first direction rows are spaced from each adjacent row to define a plurality of parallel aligned spaces.

11. A power generating device according to claim 10 wherein each of said rows extending in said second direction is spaced apart from each adjacent row extending in said second direction to define a plurality of parallel spaces extending in said second direction.

12. A power generating device according to claim 9 wherein alternate ones of said rows extending in said first direction are spaced apart from other alternate ones of said rows extending in said first direction but are not spaced apart from adjacent ones of said rows extending in said first direction.

13. A power generating device according to claim 12 wherein alternate ones of said rows extending in said second direction are spaced apart from other alternate ones of said rows extending in said second direction but are not spaced apart from adjacent ones of said rows extending in said second direction.

14. A method for generating electric power comprising the steps of:
(a) providing a sheet of piezo material having the capability of generating an electric field when subjected to mechanical strain, said sheet having a first surface and a second surface spaced therefrom and substantially parallel thereto,
(b) forming a plurality of recesses or holes in said sheet extending from the first surface toward the second surface, said recesses or holes being positioned (i) in a plurality of rows, each extending in a straight line path in a first direction and being parallel to each adjacent row extending in said first direction, and (ii) a plurality of rows, each extending in a second direction substantially perpendicular to said first direction, and
(c) positioning magnetostrictive material in at least some of said recesses or holes;
(d) subjecting said piezo sheet and said magnetostrictive material to a magnetic field different from the magnetic field, if any, at the time of positioning as set forth in step (c);
wherein steps (a), (b), (c), and (d) form a power generating device and further including the step of tuning the resonant frequency of said device, said tuning including the step of varying the size or shape of said recesses or holes.

15. The method according to claim 14 further including the step of positioning said recesses or holes such that each of said rows extending in said first direction is spaced from each adjacent row to define a plurality of parallel aligned spaced.

16. The method according to claim 15 further including the steps of positioning said recesses or holes such that each of said rows extending in said second direction is spaced apart from each adjacent row extending in said second direction.

17. The method according to claim 15 further including the step of positioning said recesses or holes such that alternate ones of said rows extending in said second direction are spaced apart from other alternate ones of said rows extending in said second direction but are not spaced apart from adjacent ones of said rows extending in said second direction.

18. The method according to claim 14 further including the step of positioning said recesses or holes such that alternate ones of said rows extending in said first direction are spaced apart from other alternate ones of said rows extending in said first direction but are not spaced apart from adjacent ones of said rows extending in said first direction, and alternate ones of said rows extending in said second direction are spaced apart from other alternate ones of said rows extending in said second direction but are not spaced apart from adjacent ones of said rows extending in said second direction.

19. A method according to claim 14 wherein said recesses or holes are square.

20. A method for generating electric power comprising the steps of:
(a) providing a sheet of piezo material having the capability of generating an electric field when subjected to mechanical strain, said sheet having a first surface and a second surface spaced therefrom and substantially parallel thereto,
(b) forming a plurality of recesses or holes in said sheet extending from the first surface toward the second surface, said recesses or holes being positioned (i) in a plurality of rows, each extending in a straight line path in a first direction and being parallel to each adjacent row extending in said first direction, and (ii) a plurality of rows, each extending in a second direction substantially perpendicular to said first direction, and
(c) positioning magnetostrictive material in at least some of said recesses or holes;
(d) subjecting said piezo sheet and said magnetostrictive material to a magnetic field different from the magnetic field, if any, at the time of positioning as set forth in step (c) wherein steps (a), (b), (c), and (d) form a power generating device and further including the step of tuning the resonant frequency of said device, said tuning including the step of varying the density of said recesses or holes.

21. A method for generating electric power comprising the steps of:
(a) providing a sheet of piezo material having the capability of generating an electric field when subjected to mechanical strain, said sheet having a first surface and a second surface spaced therefrom and substantially parallel thereto,
(b) forming a plurality of recesses or holes in said sheet extending from the first surface toward the second surface, said recesses or holes being positioned (i) in a plurality of rows, each extending in a straight line path in a first direction and being parallel to each adjacent row extending in said first direction, and (ii) a plurality of rows, each extending in a second direction substantially perpendicular to said first direction, and
(c) positioning magnetostrictive material in at least some of said recesses or holes;

(d) subjecting said piezo sheet and said magnetostrictive material to a magnetic field different from the magnetic field, if any, at the time of positioning as set forth in step (c) wherein steps (a), (b), (c), and (d) form a power generating device and further including the step of tuning the resonant frequency of said device, said tuning including the step of varying the number of said recesses or holes in which said magnetostrictive material is positioned.

22. A method for generating electric power comprising the steps of:
- (a) providing a sheet of piezo material having the capability of generating an electric field when subjected to mechanical strain, said sheet having a first surface and a second surface spaced therefrom and substantially parallel thereto,
- (b) forming a plurality of recesses or holes in said sheet extending from the first surface toward the second surface, said recesses or holes being positioned (i) in a plurality of rows, each extending in a straight line path in a first direction and being parallel to each adjacent row extending in said first direction, and (ii) a plurality of rows, each extending in a second direction substantially perpendicular to said first direction, and
- (c) positioning magnetostrictive material in at least some of said recesses or holes;
- (d) subjecting said piezo sheet and said magnetostrictive material to a magnetic field different from the magnetic field, if any, at the time of positioning as set forth in step (c) wherein steps (a), (b), (c), and (d) form a power generating device and further including the step of tuning the resonant frequency of said device, said tuning including the step of varying the materials from which the piezo sheet is manufactured.

23. A method for generating electric power comprising the steps of:
- (a) providing a sheet of piezo material having the capability of generating an electric field when subjected to mechanical strain, said sheet having a first surface and a second surface spaced therefrom and substantially parallel thereto,
- (b) forming a plurality of recesses or holes in said sheet extending from the first surface toward the second surface, said recesses or holes being positioned (i) in a plurality of rows, each extending in a straight line path in a first direction and being parallel to each adjacent row extending in said first direction, and (ii) a plurality of rows, each extending in a second direction substantially perpendicular to said first direction, and
- (c) positioning magnetostrictive material in at least some of said recesses or holes;
- (d) subjecting said piezo sheet and said magnetostrictive material to a magnetic field different from the magnetic field, if any, at the time of positioning as set forth in step (c) wherein steps (a), (b), (c), and (d) form a power generating device and further including the step of tuning the resonant frequency of said device, said tuning including the step of varying the materials for the magnetostrictive material in said recesses or holes.

\* \* \* \* \*